United States Patent
Aspar et al.

(12) 
(10) Patent No.: US 6,465,327 B1
(45) Date of Patent: Oct. 15, 2002

(54) METHOD FOR PRODUCING A THIN MEMBRANE AND RESULTING STRUCTURE WITH MEMBRANE

(75) Inventors: Bernard Aspar, Rives; Michel Bruel, Veurey; Claude Jaussaud, Tonnelles; Chrystelle Lagahe, Voreppe, all of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/763,860

(22) PCT Filed: Jun. 29, 2000

(86) PCT No.: PCT/FR00/01898

§ 371 (c)(1),
(2), (4) Date: Feb. 28, 2001

(87) PCT Pub. No.: WO01/03172

PCT Pub. Date: Jan. 11, 2001

(30) Foreign Application Priority Data

Jun. 30, 1999 (FR) .............................................. 99 08380

(51) Int. Cl.$^7$ ................................................. H01L 21/46
(52) U.S. Cl. ........................ 438/458; 438/506; 438/455; 438/691
(58) Field of Search ................................. 438/507, 459, 438/258, 458, 691, 781, 455, 409, 506, 406, 706

(56) References Cited

U.S. PATENT DOCUMENTS

| | | | | |
|---|---|---|---|---|
| 5,110,748 A | * | 5/1992 | Sarma | ............................ 43/51 |
| 5,310,446 A | * | 5/1994 | Konishi et al. | ............... 117/58 |
| 5,374,564 A | | 12/1994 | Bruel | |
| 5,714,395 A | | 2/1998 | Bruel | |
| 5,854,123 A | * | 12/1998 | Sato et al. | ................... 438/507 |

(List continued on next page.)

FOREIGN PATENT DOCUMENTS

| | | | |
|---|---|---|---|
| EP | 0 849 788 | 6/1998 | |
| FR | 2 681 472 | 3/1993 | |
| FR | 7 725 074 | 3/1996 | |
| FR | 0 738 671 | 3/1997 | |
| FR | 2 748 851 | 2/1998 | |
| FR | 2 767 416 | 2/1999 | |
| JP | 09308493 | * 5/1999 | .......... H01L/21/265 |
| JP | 09358759 | * 7/1999 | .......... H01L/21/265 |
| JP | 10031037 | * 8/1999 | .......... H01L/21/265 |

*Primary Examiner*—Matthew Smith
*Assistant Examiner*—Renzo N. Rocchegiani
(74) *Attorney, Agent, or Firm*—Oblon, Spivak, McClelland, Maier & Neustadt, P.C.

(57) ABSTRACT

The invention relates to a method for producing a thin membrane, comprising the following steps:

Figure 1:
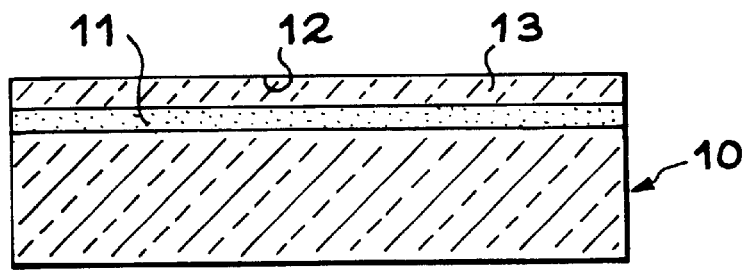

implanting gas species, through one surface of a first substrate (10) and through one surface of a second substrate (20), which in said substrates are able to create microcavities (11, 21) delimiting, for each substrate, a thin layer (13, 23) lying between these microcavities and the implanted surface, the microcavities being able, after their implantation, to cause detachment of the thin layer from its substrate;

assembly of the first substrate (10) onto the second substrate (20) such that their implanted surfaces face one another;

detaching each thin layer (13, 23) from its substrate (10, 20), the thin layers remaining assembled together to form said thin membrane.

The invention also concerns a thin membrane structure obtained with this method.

24 Claims, 2 Drawing Sheets

U.S. PATENT DOCUMENTS

| | | | |
|---|---|---|---|
| 5,863,830 A | | 1/1999 | Bruel et al. |
| 5,877,070 A | | 3/1999 | Goesele et al. |
| 5,882,987 A | * | 3/1999 | Srikrishnan ................. 438/458 |
| 5,966,620 A | * | 10/1999 | Sakaguchi et al. .......... 438/455 |
| 5,993,677 A | * | 11/1999 | Biasse et al. ............... 438/691 |
| 6,020,252 A | | 2/2000 | Aspar et al. |
| 6,083,324 A | * | 7/2000 | Henley et al. ............. 148/33.2 |
| 6,140,210 A | * | 10/2000 | Aga et al. .................... 438/458 |
| 6,146,979 A | * | 11/2000 | Henley et al. .............. 438/458 |
| 6,245,161 B1 | * | 6/2001 | Henley et al. ............. 148/33.4 |
| 6,251,754 B1 | * | 6/2001 | Ohshima et al. ............ 438/506 |
| 6,323,109 B1 | * | 11/2001 | Okonogi ...................... 438/459 |
| 6,335,258 B1 | * | 1/2002 | Aspar et al. ................. 438/406 |
| 6,346,459 B1 | * | 2/2002 | Usenko et al. .............. 438/458 |
| 6,350,653 B1 | * | 2/2002 | Adkisson et al. ........... 438/258 |
| 6,355,541 B1 | * | 3/2002 | Holland et al. ............. 438/459 |
| 6,365,488 B1 | * | 4/2002 | Liao ........................... 438/406 |
| 6,380,046 B1 | * | 4/2002 | Yamazaki ................... 438/409 |
| 6,391,799 B1 | * | 5/2002 | Di Cioccio ................. 438/781 |

* cited by examiner

METHOD FOR PRODUCING A THIN MEMBRANE AND RESULTING STRUCTURE WITH MEMBRANE

TECHNICAL FIELD

The present invention concerns a method for producing a thin membrane and the membrane structure so obtained. This membrane may be made up of one or more materials, monocrystalline materials in particular. It may be self-supporting or fixed to a supporting substrate to rigidify the structure so obtained.

This type of membrane offers many advantages. By way of example, mention may be made of compliant substrates which may use a membrane of the invention, or any other application in which a thin film is required (silicon film on a glass or plastic substrate). By compliant substrate is meant a structure able to accept the stresses induced by a structure adhering to it, and which may be a layer deposited on a surface of this substrate by heteroepitaxy for example.

PRIOR ART

FR-A-2 681 472 describes a method for fabricating thin films in semiconductor material. This document discloses that the implanting of a rare gas or of hydrogen into a substrate in semiconductor material is able to create microcavities or microbubbles called "platelets" at a depth close to the average penetration depth of the implanted ions. If this substrate is placed in intimate contact, via its implanted surface, with a stiffener, and if heat treatment is applied at a sufficient temperature, an interaction occurs between the microcavities or platelets leading to separation of the semiconductor substrate into two parts: firstly a thin semiconductor film adhering to the stiffener, and secondly the remainder of the semiconductor substrate. Separation occurs at the site where the microcavities or platelets are present. Heat treatment is such that the interaction between the microcavities or platelets formed by implantation causes the separation of the thin film from the remainder of the substrate. A transfer therefore takes place of a thin film from an initial substrate to a stiffener acting as a support for this thin film.

This method may also be applied to the fabrication of a thin film in solid material other than a semiconductor material (a conductor or dielectric material), whether crystalline or not.

With the methods described in FR-A-2 681 472 (corresponding to U.S. Pat. No. 5,374,564) already cited and FR-A-2 767 416, it is possible to transfer a thin film in homogeneous material or made up of homogeneous or heterogeneous multilayers to a mechanical support also called a stiffener. This transfer is advantageously conducted using heat treatment. However, this heat treatment may be associated with or entirely replaced by mechanical separation, for example by using tensile and/or shearing and/or flexion forces applied in separate or combined manner. Such process is described in FR-A-2 748 851.

It has also been shown that this technique could be used without a stiffener if the implanted ions are located at a sufficient depth to induce fracture over the entire substrate with no blister formation at the implanted surface. In this respect, reference may be made to FR-A-2 738 671 (corresponding to U.S. Pat. No. 5,714,395). In this case, to obtain a fracture, the microcavity zone needs to be at a minimum depth relative to the implanted surface so that the thin film may be sufficiently rigid. This rigidity may also be obtained through the use of one or more layers deposited on the thin layer with fracture.

The documents cited above describe methods with which it is possible to obtain a thin layer of material. This layer may be homogeneous, contain all or part of a microelectronic or optoelectronic component, or even be heterogeneous. By heterogeneous is meant that it may be made up of several elements stacked on top of each other. These stacks of layers are generally obtained by epitaxial growth. With epitaxial growth the problem is raised of compatibility between the different layers. These compatibility problems may for example relate to widely varying mesh parameters leading to dislocations in at least one of the layers. On this account, some structures appear impossible to obtain.

Also, document FR-A-2 738 671 already cited, indicates that implantation must be conducted at an energy such that the ion penetration depth is at least equal to a minimum depth for the film to be rigid. It is indicated that, for silicon, the minimum penetration depth is in the order of 5 $\mu$m even 4 $\mu$m. This relates to an implanting energy of approximately 500 keV. For silicon carbide, which is a much more rigid material than silicon, the minimum possible thickness of the thin film is in the order of 1 $\mu$m. With this method, it is therefore possible to obtain thin films or layers whose thickness is greater than a minimum thickness needed to provide the thin layer with some extent of rigidity. It is indicated that a rigid thin layer is a layer whose mechanical properties are sufficient during the second step (which corresponds to heat and/or mechanical treatment) to avoid the onset of swelling, platelets or platelet burst and hence are sufficient for application of the second step to achieve surface detachment. However, with this method, it is impossible, depending upon the mechanical nature of the required film, to obtain self-supporting thin films using standard commercially available implanters, that is to say using implanters having a maximum implanting energy of 200 keV. For example, it is impossible to obtain a silicon film having a thickness of 4 $\mu$m with such energy.

Another problem is raised if it is desired to use a standard implanter (energy less than 200 keV) to transfer a thin film onto an ordinary support, that is to say a support which does not have sufficient rigidity to obtain a stiffening effect. For example, it is not possible to transfer a monocrystalline silicon film onto a flexible support such as a plastic support without using an intermediate support of handle-type such as disclosed in FR-A-2 725 074. However, it would be advantageous to have available a method with which it is possible a overcome the need for this handle-type support and which enables direct transfer of the thin film onto its final support.

DISCLOSURE OF THE INVENTION

The invention provides a solution to the above-cited problems. The solution is put forward to fix two substrates to one another via their implanted surface, implantation being conducted such that the substrate cleavage phenomenon may occur at the implanted zones. It is then possible to obtain a membrane formed by the joining of the two thin layers. This membrane may be transferred onto any type of support (semiconductor, metal, plastic, ceramic) with no condition as to adhering force (strong or weak) between the membrane and the support.

The subject matter of the invention is therefore a method for producing a thin membrane, characterised in that it comprises the following steps:

implanting gas species through one surface of a first substrate and through one surface of a second substrate which, in such substrates, are able to create microcavities delimiting for each substrate a thin layer lying between these microcavities and the implanted surface, the microcavities being able, after their implantation, to cause detachment of the thin layer from its substrate;

assembly of the first substrate onto the second substrate such that the implanted surfaces face one another;

detaching each thin layer from its substrate, the thin layers remaining assembled together to provide said thin membrane.

By gas species is meant elements, hydrogen or rare gases for example, in their atomic form (H for example) or in their molecular form ($H_2$ for example) or in their ionic form ($H^+$, $H^+_2$... for example) or in their isotopic form (deuterium for example) or in isotopic and ionic form.

Also, by implantation is meant any means of inserting the previously defined species, either alone or in combination, such as ion bombardment, diffusion, etc.

According to one variant of embodiment, the steps are conducted in the following order:

implanting the first substrate and the second substrate, assembly of the first substrate onto the second substrate via the implanted surfaces, detaching each thin layer, either simultaneously or in succession.

According to a second variant of embodiment, the steps are conducted in the following order:

implanting the first substrate, assembly of the implanted surface of the first substrate onto a surface of the second substrate intended to undergo subsequent implanting, detaching the thin layer from the first substrate, which layer remains assembled to the second substrate, implanting the second substrate through the thin layer detached from the first substrate, detaching the thin layer from the second substrate, which layer remains assembled to the thin layer of the first substrate to provide said thin membrane.

In both substrates, a preliminary step may be provided prior to the implanting and assembly of the two substrates, consisting of making a layer of inclusions in the substrate to be implanted, at a depth corresponding to the required thickness for the thin layer to be made in this substrate, the inclusions forming traps for the gas species which are to be implanted, for example by ion implantation or diffusion. The layer of inclusions may be formed using a film depositing technique. It may consist of generating lines or generating grain joints.

The average implantation depth of the gas species, in a substrate in monocrystalline material, may be determined in relation to the arrangement of the crystallographic network of the monocrystalline material relative to the direction of implantation. For a given energy, greater average depths of penetration of gas species can be achieved if channelling of the ions or implanted species is used. For this purpose, it suffices to conduct implantation parallel to a crystallographic direction or plane (with monocrystalline material only). In contrary manner, it is possible to reduce the implantation depth at a given energy by conducting inclined implanting. In this case, the crystallographic axis of the material is oriented such that there is no preferential direction of ion penetration in the material.

Optionally, implantation is conducted through one surface of the first substrate and/or of the second substrate from which all or part of at least one electronic and/or optoelectronic and/or optic component and/or microsystem has been fabricated. Implantation may be effective even for masked areas.

According to another embodiment, if detachment of each thin layer is made in successive manner, after a first thin layer detachment has been made, all or part of at least one electronic and/or optoelectronic and/or optic component and/or microsystem is fabricated on the thin layer uncovered by this first detachment. By way of example, the component made in one thin layer is a DRAM memory. If there is surface topology, this surface may be planarized before contacting.

The assembly of the first substrate onto the second substrate may be made using a technique chosen from among bonding by molecular adhesion, bonding by means of an adhesive substance and use of an intermediate compound.

This assembly of the first substrate onto the second substrate may also be made by inserting an intermediate layer. The presence of an intermediate layer may modify the apparent rigidity of the membrane and modify transfer conditions. In particular, it may modify the annealing conditions and/or the mechanical fracture conditions.

Advantageously, the detachment of said thin layers is made by applying heat treatment and/or by applying mechanical forces. In all cases, the transfer conditions evidently depend upon implantation conditions (dose, energy, heat schedule supplied to wafer) and the stresses placed by the structure on the implanted zone. The mechanical forces may comprise tensile and/or shearing and/or flexion forces. The mechanical forces may be applied perpendicular to the planes of the layers and/or parallel thereto. They may be restricted to one point or one zone or applied to different sites in symmetric or asymmetric fashion. The heat energy supplied may for example be supplied using a laser beam. The mechanical energy applied may be applied using ultrasound.

If the detachment of a thin layer implies the application of heat treatment, the latter may be applied under controlled pressure (for example a gas or mechanical pressure). Lowering of the pressure at the time of heat treatment or at the time of separation may facilitate separation. In this way, it is possible to obtain separations at lower doses of implanted gas and/or lower heat treatments. By lower heat treatments is meant annealing conducted at a lower temperature and/or for a shorter time period. If pressure is increased, the fracturing conditions at the time separation occurs are modified and separation can be delayed. This delay may be advantageous in that it induces less surface roughness after fracturing but it may also enable fracturing to be obtained under conditions in which platelet formation is achieved with annealing at atmospheric pressure.

In relation to applications, after detachment from at least one substrate, the thin membrane may be fixed to a final or temporary support.

A further purpose of the invention is a thin membrane structure obtained using the above method. This structure may comprise a support carrying this membrane, this support possibly being in a material chosen from among semiconductor materials, plastic materials, ceramic materials, and transparent materials.

One of the thin layers may be in silicon and the other in III–V semiconductor material, GaAs for example.

The membrane may also comprise an intermediate layer inserted between the two thin layers. For example, the two thin layers are in Si and the intermediate layer is in $SiO_2$, in $Si_3N_4$ or in a combination of several materials and/or multilayers. According to another example, the two thin layers are in semiconductor material and the intermediate layer is in a conductor material such as palladium.

According to another variant of embodiment, one of the layers is in Si, the other layer is in Ge, the thin layers being doped so that the structure forms a photovoltaic cell.

SHORT DESCRIPTION OF THE DRAWINGS

Figure 3:
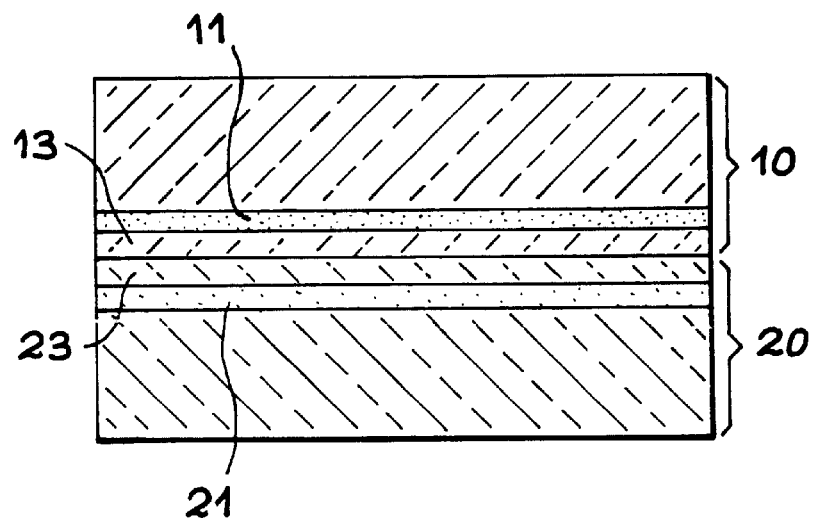
Figure 4:
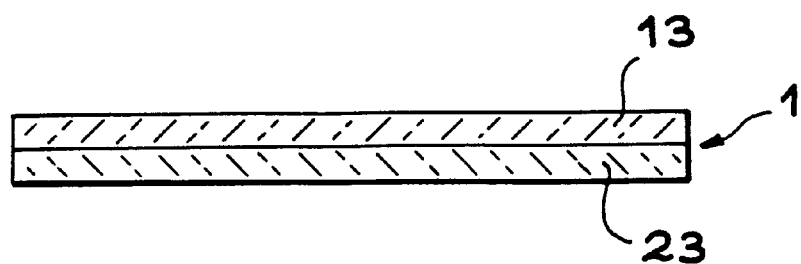
Figure 5:
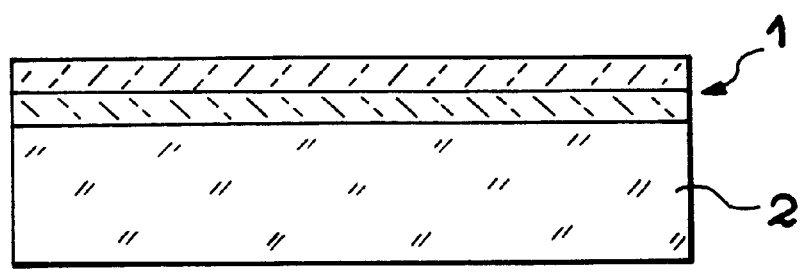
Figure 6:
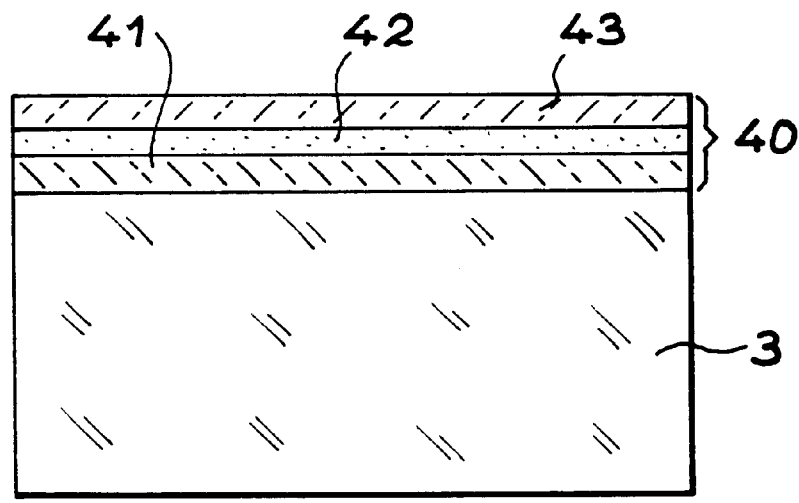

The invention will be better understood and other advantages and particular aspects will become apparent on reading the following description, which is given as an illustrative, non-restrictive example with reference to the appended drawings in which:

FIGS. 1 to 4 illustrate different steps of the method of the present invention to obtain a self-supporting membrane, FIG. 5 represents a first structure comprising a support carrying a thin membrane of the present invention, FIG. 6 represents a second structure comprising a support carrying a thin membrane of the present invention.

DETAILED DESCRIPTION OF THE EMBODIMENTS OF THE INVENTION

The substrates used to produce the thin layers may be solid or already comprise one or more thin layers deposited by epitaxy for example.

The implantation of gas species may be conducted, for each substrate, at different energies and doses. It may also be conducted using different gas species.

The fixing of the substrates onto one another may be made by bonding through molecular adhesion optionally with the presence of an intermediate layer which may have different functions. It may be chosen on account of its electronic and/or optic and/or mechanical and/or thermal properties. It may be insulating or conductive. Its mechanical properties may be chosen such as to rigidify the structure and enable a reduction in required thickness.

The separation of the thin layers with their substrates may be made in simultaneous or consecutive manner. Separation may be made using heat treatment and/or by means of mechanical forces applied simultaneously or after optional heat treatment. If the purpose of heat treatment is to obtain separation, this must be made with a heat schedule in relation to all other heat treatments preceding this annealing (implantation, bonding, . . ). If separation uses a mechanical force, heat treatment may be low or even non-existent if the wafer has been sufficiently weakened during the implantation stage. Mechanical separation is conducted, for example, by means of tensile, shearing or flexion forces applied in separate manner or in conjunction with one another.

One variant of the method consists, after total separation (that is to say of the two substrates) or partial separation (that is to say of one substrate), of placing one of the thin layers in contact with a support which will carry the membrane. This support may be an intermediate support to enable the conducting of component fabrication steps, or it may be the final support. The use of an intermediate support means that it is possible to choose the surface on which these steps will be conducted.

The invention offers many advantages which are summarised below.

It provides the opportunity to obtain self-supporting membranes by ion implantation using conventional implanters which operate at implanting energies in the order of 200 keV.

For a given membrane thickness, when the two substrates are implanted before their fixation, the use of two implanted substrates makes it possible to reduce the depth of implantation by one half and hence to reduce the energy required for this implantation. This energy reduction modifies the minimum dose required for the transfer of a thin layer. It has been found that the minimum dose enabling such transfer increases when implantation energy increases. As an example, in the case of hydrogen ions and for an energy of 90 keV, the dose required for transfer is in the order of $3.5 \cdot 10^{16}$ H$^+$/cm$^2$ whereas this does is in the order of $4.5 \cdot 10^{16}$ H$^+$/cm$^2$ at 400 keV (dose given by way of indication for one same implanter, that is to say under fixed conditions of implant current, thermal contact, optional cooling). In short, two implantations do not necessarily lead to a double dose.

It is possible to obtain thin membranes made up of at least two layers in different materials. All that it is required is to place two types of implanted materials in contact, contacting possibly being made by different means (bonding by molecular adhesion, use of an intermediate compound, or even use of an adhesive). Among such intermediate compounds, metal compounds may be cited as an example, or insulating compounds and/or compounds which give control over the stresses which occur in the structure subsequent to the association of layers in different materials. It is therefore possible, with this method, to produce different structures having at least two monocrystalline layers which may optionally be positioned either side of an insulating or conductor film.

It is possible to produce the chosen structure through the choice of implantation depths which may be different in either case. With this possibility, asymmetric membranes can be obtained. It is to be noted that the minimum dose required for separation is related to the implantation energy and the material.

Since there are two zones (one in each substrate), containing microcavities leading to separation of the substrates by fracture, it is possible to control one fracture zone in relation to the other. If substrate implantation is conducted under different conditions for each substrate, it is possible to obtain firstly the separation of one layer from its substrate while the other layer still remains integral with its substrate. In this way a membrane is obtained, formed of two thin layers still integral with one of the substrates. It is then possible to fabricate all or part of one or more components on the surface uncovered by separation. In particular, the steps comprising heat treatment can be conducted. Subsequently, this uncovered surface can be bonded to a support and the separation of the other thin layer from its substrate can be achieved using mechanical forces and/or heat treatment.

The advantage of obtaining a very thin membrane is that it can be deposited on any support with no strong adhesion existing between the membrane and this support. It is then possible to obtain a self-supporting membrane which is of interest in particular for compliant substrate applications or for transfer to substrates having a strong variation in thermal dilatation coefficient.

The gas species may be inserted or located at the zone chosen for fracture by different methods. For example ion implantation by bombardment may be cited (equivalent to plasma immersion) or methods based on diffusion and trapping by inclusions.

FIGS. 1 to 4 are cross-section views which illustrate how a self-supporting membrane is obtained with the method of the present invention, using two silicon substrates implanted in identical manner.

Implantation is conducted for example with hydrogen ions at a dose of $7 \cdot 10^{16}$ H$^+$/cm$^2$ for an energy of 200 keV.

Figure 2:
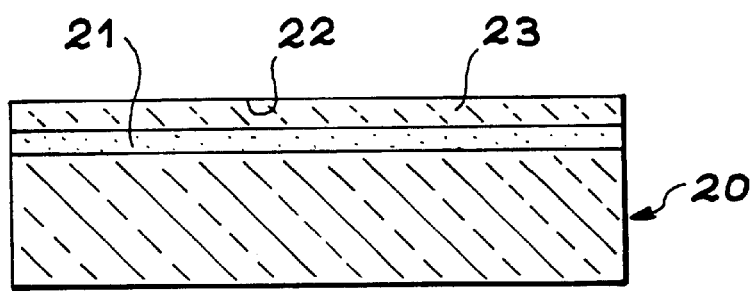

The result obtained is illustrated in FIGS. 1 and 2. FIG. 1 shows a first substrate 10 having a continuous, embedded zone of microcavities 11 separated from the implanted surface 12 by a thin layer 13. FIG. 2 shows a second substrate 20 having a continues, embedded zone of microcavities 21 separated from the implanted surface 22 by a thin layer 23.

Substrates 10 and 20 are then bonded to one another via implanted surfaces 12 and 22 using a molecular bonding technique. The structure shown in FIG. 3 is obtained.

Annealing of this structure at a temperature of approximately 500° C. for 30 minutes or 400° C. for 1 hour causes fracture of the substrates in the microcavity zones. This heat schedule can be lowered if implantation conditions are modified, for example if the dose is modified. After fracture of the substrates, a membrane subsists approximately 3.5 µm thick made up of the association of the two thin layers.

After removal of at least one of the two substrates, the membrane is ready and may be recovered either manually (it is then self-supporting) or by causing it to adhere to a support (for example a semiconductor wafer) or by bonding it to a flexible plastic film.

FIG. 4 shows a self-supporting membrane 1 made up of two thin layers 13 and 23.

FIG. 5 shows a structure comprising a support 2, in glass for example, to which membrane 1 has been bonded. Support 2 may have a thermal dilatation coefficient that is different to that of the membrane. It may be in pure silica for example.

For some applications, it may be advantageous to have an oxide layer within the membrane. For this purpose, one of the substrates (or both) is covered with an oxide layer. In this way a membrane is obtained formed of a thin layer of silicon on an oxide layer which itself lies on a thin layer of silicon. This membrane may be transferred to any support. This is shown in FIG. 6 which illustrates a structure comprising a support 3, in glass for example, to which a membrane 40 has been bonded. This membrane 40 comprises a first silicon layer 41 lying on support 3, an oxide layer 42 and a second silicon layer 43.

For other applications, if an electric contact is desired between the two layers of the membrane, an intermediate metal layer may be used, in palladium for example.

The method of the present invention leads to obtaining a membrane comprising a layer of GaAs and a layer of silicon using corresponding substrates. By way of example, the GaAs substrate is implanted with a dose of $8 \cdot 10^{16}$ H$^+$/cm$^2$ at 200 keV, and the silicon substrate is implanted with a dose of $10^{17}$ H$^+$/cm$^2$ at 200 keV. The two substrates, after cleaning, are joined via their implanted surfaces by molecular adhesion. The structure obtained is annealed in an oven at 250° C. for 30 minutes. This heat treatment induces a fracture the length of the implanted zone in the GaAs substrate. At this stage, the transfer has been obtained of a layer of GaAs onto an implanted silicon substrate. Annealing at 350° C. for 1 hour of the structure obtained causes a fracture the length of the zone implanted in the silicon substrate. A thin membrane is obtained, made up of a thin layer of silicon and a thin layer of GaAs, which may be used as a growth substrate to form a layer of a new material.

With this method, it is also possible to obtain a membrane solely in GaAs using two substrates in GaAs. Through the method of the invention, this membrane may be transferred to any type of support, even if the surface condition of the latter is incompatible with bonding by molecular adhesion, or if the thermal dilatation coefficients between the different materials of the structure are such that strong thermal stresses occur if the structure so formed is annealed. With this method it is also possible to fix the membrane to its support using a simple adhesive or by soldering or brazing.

Using the method of the invention, it is possible to produce a photovoltaic cell comprising two materials (Si and Ge) having complementary absorption spectra, in order to absorb a large part of the sun spectrum with thin layers. For this purpose, a silicon substrate is implanted with a dose of $7 \cdot 10^{16}$ H$^+$/cm$^2$ and an energy of 200 keV with a view to obtaining a thin layer 1.8 µm thick. A germanium substrate is implanted with a dose of $7 \cdot 10^{16}$ H$^+$/cm$^2$ and an energy of 200 keV with a view to obtaining a thin layer 1.6 µm thick. If necessary, the Si and Ge substrates are previously strongly doped on the surface to form a tunnel junction in the future membrane. The substrates are then bonded together by molecular adhesion via their implanted surfaces. This bonding may be conducted through the intermediary of a conductor and/or transparent layer, for a example a Pd or AlTi film 10 nm thick.

By annealing at 500° C. for 30 minutes, a fracture is made in the silicon substrate to obtain the corresponding thin layer. The remaining part of the silicon substrate is removed. Epitaxy may optionally be carried out on the thin silicon layer in order to improve photon absorption by the silicon. This epitaxy may be conducted in liquid phase or gas phase.

The cell parts on the silicon side are then fabricated, at a temperature of less than 937° C. and the structure is bonded, silicon side, to a glass support.

Using mechanical forces, tensile forces for example, the thin layer of germanium is then detached from its substrate to obtain a membrane. A metal film is then deposited on the thin layer of germanium to form the rear surface electrode of the cell which is encapsulated.

By conducting hydrogen implantations at higher energy (at 400 keV for example), thicker silicon and germanium layers would be obtained, which therefore offer greater photon absorption.

In this example, the advantage can be seen of producing membranes made up of two materials of greater thickness and at all events greater than the thicknesses obtained with an implantation energy of 200 keV.

What is claimed is:

1. Method for producing a thin membrane (1, 40), characterised in that it comprises the following steps:

implantation of gas species through one surface (12) of a first substrate (10) and through one surface (22) of a second substrate (20), which in said substrates are able to create microcavities (11, 21) delimiting for each substrate a thin layer (13, 23) lying between these microcavities and the implanted surface, the microcavities being able, after their implantation, to cause detachment of the thin layer from its substrate;

assembly of the first substrate (10) onto the second substrate (20) such that the implanted surfaces (12, 22) face one another;

detachment of each thin layer from its substrate, the thin layers (13, 23) remaining assembled together to provide said thin membrane (1, 40).

2. Method according to claim 1, characterised in that these steps are conducted in the following order:

implantation of the first substrate (10) and second substrate (20), assembly of the first substrate (10) onto the second substrate (20) via the implanted surfaces (12, 22), detachment of each thin layer (13, 23) either in simultaneous or in successive manner.

3. Method according to claim 1, characterised in that the steps are conducted in the following order:
   implantation of the first substrate,
   assembly of the implanted surface of the first substrate onto one surface of the second substrate intended to be subsequently implanted,
   detachment of the thin layer from the first substrate, which layer remains assembled to the second substrate,
   implantation of the second substrate through the thin layer detached from the first substrate,
   detachment of the thin layer from the second substrate, which layer remains assembled to the thin layer of the first substrate to provide said thin membrane.

4. Method according to claim 1, characterised in that a preliminary step is provided prior to implantation, consisting of fabricating a layer of inclusions in the substrate to be implanted, at a depth corresponding to the required thickness of the thin layer to be made in this substrate, the inclusions forming traps for the gas species which will be subsequently implanted.

5. Method according to claim 1, characterised in that the average implantation depth of the gas species, in a substrate in monocrystalline material, is determined in relation to the arrangement of the crystallographic network of the monocrystalline material relative to the direction of implantation.

6. Method according to claim 1, characterised in that implantation is conducted through one surface of the first substrate and/or of the second substrate from which all or part of at least one electronic and/or optoelectronic and/or optic component and/or a microsystem was fabricated.

7. Method according to claim 1, characterised in that the detachment of each thin layer being made successively, after a first detachment of thin layer has been made, all or part of at least one electronic and/or optoelectronic and/or optic component and/or a microsystem is made on the thin layer uncovered by this first detachment.

8. Method according to claim 1, characterised in that the assembly of the first substrate (10) onto the second substrate (20) is made using a technique chosen from among bonding by molecular adhesion, bonding by means of an adhesive substance or use of an intermediate compound.

9. Method according to claim 1, characterised in that the assembly of the first substrate onto the second substrate is made with the insertion of an intermediate layer (42).

10. Method according to claim 1, characterised in that the detachment of said thin layers (13, 23) is made by applying heat treatment and/or by applying mechanical forces.

11. Method according to claim 10, characterised in that said mechanical forces comprise tensile and/or shearing and/or flexion forces.

12. Method according to claim 10, characterised in that the detachment step comprises the use of a laser beam to provide the microcavities with thermal energy.

13. Method according to claim 10, characterised in that the detachment step comprises the use of ultrasound to provide the microcavities with mechanical energy.

14. Method according to claim 10, characterised in that, the detachment involving the application of heat treatment, the latter is conducted under controlled pressure.

15. Method according to claim 1, characterised in that after detachment from at least one substrate, the thin membrane is fixed to a final or temporary support.

16. Thin membrane structure (1, 40) obtained according to claim 1.

17. Structure according to claim 16, characterised in that it comprises a support (2, 3) carrying said membrane (1, 40).

18. Structure according to claim 17, characterised in that the support is in a material chosen from among semiconductor materials, plastic materials, ceramic materials and transparent materials.

19. Structure according to claim 10, characterised in that one of the thin layers is in silicon and the other in III-V semiconductor material.

20. Structure according to claim 16, characterised in that the membrane (40) also comprises an intermediate layer (42) positioned between the two thin layers (41, 43).

21. Structure according to claim 20, characterised in that the two thin layers are in Si and the intermediate layer is in $SiO_2$, in $Si_3N_4$ or in a combination of several materials and/or multilayers.

22. Structure according to claim 20, characterised in that the two thin layers are in semiconductor material and the intermediate layer is in conductor material.

23. Structure according to claim 22, characterised in that the intermediate layer is in palladium.

24. Structure according to claim 17, characterised in that one of the thin layers is in Si, the other layer is in Ge, the thin layers being doped so that the structure forms a photovoltaic cell.

* * * * *